（12）United States Patent
Lee et al.

(10) Patent No.: US 11,304,275 B2
(45) Date of Patent: Apr. 12, 2022

(54) LIGHT EMITTING DEVICE AND DISPLAY DEVICE HAVING THE SAME

(71) Applicant: Samsung Display Co., LTD., Yongin-si (KR)

(72) Inventors: Dae-Sik Lee, Hwaseong-si (KR); Jiyoun Seo, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/899,061

(22) Filed: Jun. 11, 2020

(65) Prior Publication Data

US 2021/0068219 A1    Mar. 4, 2021

(30) Foreign Application Priority Data

Aug. 27, 2019    (KR) .................. 10-2019-0104945

(51) Int. Cl.
| | |
|---|---|
| *H05B 45/14* | (2020.01) |
| *H05B 45/325* | (2020.01) |
| *H05B 45/48* | (2020.01) |
| *G02F 1/13357* | (2006.01) |
| *H05K 1/18* | (2006.01) |
| *G02F 1/1335* | (2006.01) |

(52) U.S. Cl.
CPC ....... *H05B 45/14* (2020.01); *G02F 1/133603* (2013.01); *G02F 1/133605* (2013.01); *G02F 1/133606* (2013.01); *H05B 45/325* (2020.01); *H05B 45/48* (2020.01); *H05K 1/181* (2013.01); *G02F 1/133612* (2021.01); *H05K 2201/10022* (2013.01); *H05K 2201/10053* (2013.01); *H05K 2201/10106* (2013.01)

(58) Field of Classification Search
None
See application file for complete search history.

(56) References Cited

U.S. PATENT DOCUMENTS

| | | | |
|---|---|---|---|
| 10,082,698 | B2 | 9/2018 | Kang et al. |
| 10,292,235 | B2 | 5/2019 | Tsai et al. |
| 2006/0049959 | A1 | 3/2006 | Sanchez |

(Continued)

FOREIGN PATENT DOCUMENTS

| | | |
|---|---|---|
| KR | 10-1065226 | 9/2011 |
| KR | 10-2012-0061542 | 6/2012 |

(Continued)

*Primary Examiner* — Crystal L Hammond
(74) *Attorney, Agent, or Firm* — Kile Park Reed & Houtteman PLLC

(57) ABSTRACT

A light emitting device includes a light source panel including light emitting units, and a printed circuit board including a light source driving circuit electrically connected to the light source panel. The light source driving circuit receives a feedback voltage from each of the light emitting units, and compares the feedback voltage with a reference voltage to output a current control signal. Each of the light emitting units includes a light emitting diode connected to a first voltage line, a switching element connected with the light emitting diode and operating in response to the current control signal, and a resistor electrically connected between a feedback node and a second voltage line. The resistor includes a conductive pattern having a predetermined width disposed on the light source panel.

26 Claims, 9 Drawing Sheets

(56) References Cited

U.S. PATENT DOCUMENTS

| | | | |
|---|---|---|---|
| 2008/0211426 A1* | 9/2008 | Kuo | H05B 41/2855 |
| | | | 315/282 |
| 2012/0248997 A1* | 10/2012 | Jung | H05B 45/37 |
| | | | 315/192 |
| 2012/0280632 A1* | 11/2012 | Kim | H05B 45/347 |
| | | | 315/192 |
| 2013/0141322 A1* | 6/2013 | Hussain | H05B 45/50 |
| | | | 345/102 |
| 2014/0247584 A1* | 9/2014 | Kodama | H02S 30/10 |
| | | | 362/183 |
| 2015/0022122 A1 | 1/2015 | Kim et al. | |
| 2015/0131016 A1 | 5/2015 | Kim et al. | |
| 2016/0349904 A1 | 12/2016 | Miyake et al. | |
| 2018/0166615 A1 | 6/2018 | Takagishi | |

FOREIGN PATENT DOCUMENTS

| | | |
|---|---|---|
| KR | 10-2017-0085174 | 7/2017 |
| KR | 10-2021-0008246 | 1/2021 |

\* cited by examiner

LIGHT EMITTING DEVICE AND DISPLAY DEVICE HAVING THE SAME

CROSS-REFERENCE TO RELATED APPLICATION(S)

This application claims priority to and benefits of Korean Patent Application No. 10-2019-0104945 under 35 U.S.C. § 119, filed on Aug. 27, 2019 in the Korean Intellectual Property Office, the entire contents of which are incorporated herein by reference.

BACKGROUND

1. Technical Field

The disclosure relates to a display device, and, to a display device including a light emitting device.

2. Description of the Related Art

A multimedia device such as a television, a mobile phone, a tablet computer, a navigation system, and a game machine may include a display device for displaying an image or images.

Among display devices, a display device (for example, a liquid crystal display device) which is not capable of emitting light by itself may be provided with a light emitting device or a backlight unit including a light source which supplies light. The backlight unit may have the light source on a lower portion of a display panel, and thus, may supply light emitted from the light source directly to the display panel.

The backlight unit may be operated in response to control signals provided from a light source driving circuit. The light source driving circuit may control a voltage and/or a current provided to the backlight unit in response to a feedback signal from the backlight unit. The light source driving circuit that may control the backlight unit may be provided on a separate substrate, and one side of a flexible printed circuit board may be connected to one side of the backlight unit.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a backlight unit with reduced power consumption, and a display device including the same.

The disclosure also provides a backlight unit that controls a constant current for a light source, and a display device including the same.

An embodiment may provide a light emitting device including a light source panel including light emitting units, a printed circuit board including a light source driving circuit electrically connected to the light source panel, wherein the light source driving circuit receives a feedback voltage from each of the light emitting units and compares the feedback voltage with a reference voltage to output a current control signal. Each of the light emitting units may include a light emitting diode including a first terminal and a second terminal both electrically connected to a first voltage line to which a first power supply voltage is provided, a switching element electrically connected between the second terminal of the light emitting diode and a feedback node which outputs the feedback voltage, and operating in response to the current control signal, and a resistor electrically connected between the feedback node and a second voltage line to which a second power supply voltage is provided. The resistor may include a conductive pattern having a predetermined width disposed on the light source panel.

In an embodiment, the conductive pattern of the resistor of each of the light emitting units may have a predetermined length.

In an embodiment, the conductive pattern of the resistor of each of the light emitting units may have a predetermined thickness.

In an embodiment, the conductive pattern of the resistor of each of the light emitting units may have a shape of a spiral, a polygon, a circle, a zigzag, or a combination of shapes.

In an embodiment, the light source panel may be a glass substrate.

In an embodiment, the conductive pattern of the resistor of each of the light emitting units may have a same resistance value.

In an embodiment, the resistor of each of the light emitting units may include a metal wiring pattern.

In an embodiment, the light source driving circuit may provide the first power supply voltage and the second power supply voltage.

In an embodiment, the switching element may include a switching transistor including a first electrode electrically connected to the second terminal of the light emitting diode, a second electrode electrically connected to the feedback node, and a gate electrode that may receive the current control signal.

In an embodiment, the light source driving circuit may increase a pulse width of the current control signal when the feedback voltage is lower than the reference voltage, and decrease a pulse width of the current control signal when the feedback voltage is higher than the reference voltage.

In an embodiment, the light source panel may further include light source pads electrically connected to the light emitting units, and the printed circuit board may further include substrate pads electrically connected to the light source pads.

In an embodiment, the light emitting units may include a first light emitting unit and a second light emitting unit, and the light source pads may include a first light source pad and a second light source pad. The light emitting device may further comprise a first feedback line that transmits a feedback voltage of the first light emitting unit to the first light source pad, and an n-th feedback line that transmits a feedback voltage of the second light emitting unit to the second light source pad.

A length of the first feedback line may be different from a length of the n-th feedback line.

In an embodiment, a display device may include a display panel that displays an image, and a light emitting device that may provide light to the display panel, wherein the light emitting device may include a light source panel including light emitting units, and a printed circuit board including a light source driving circuit electrically connected to the light source panel. The light source driving circuit may receive a feedback voltage from each of the light emitting units, and compare the feedback voltage from each of the light emitting units with a reference voltage to output a current control signal. Each of the light emitting units may include a light emitting diode having a first terminal and a second terminal both electrically connected to a first voltage line to which a first power supply voltage may be provided, a switching element electrically connected between the second terminal of the light emitting diode and a feedback node that may output the feedback voltage, and operating in response to the current control signal, and a resistor electrically connected between the feedback node and a second voltage line to which a second power supply voltage may be provided. The resistor may include a conductive pattern having a predetermined width and length disposed on the light source panel.

In an embodiment, the conductive pattern of the resistor of each of the light emitting units may have a shape of a spiral, a polygon, a circle, a zigzag, or a combination of shapes.

In an embodiment, the light source panel may be a glass substrate.

In an embodiment, the conductive pattern of the resistor of each of the light emitting units may have the same resistance value.

In an embodiment, the resistor of each of the light emitting units may include a metal wiring pattern.

In an embodiment, light source driving circuit may provide the first power supply voltage and the second power supply voltage.

In an embodiment, the switching element may include a switching transistor including a first electrode electrically connected to the second terminal of the light emitting diode, a second electrode electrically connected to the feedback node, and a gate electrode that may receive the current control signal.

In an embodiment, the light source driving circuit may increase a pulse width of the current control signal when the feedback voltage is lower than the reference voltage, and decrease a pulse width of the current control signal when the feedback voltage is higher than the reference voltage.

In an embodiment, the light source panel may further include light source pads electrically connected to the light emitting units, and the printed circuit board may further include substrate pads electrically connected to the light source pads.

In an embodiment, the light emitting units may include a first light emitting unit and a second light emitting unit, and the light source pads may include a first light source pad and a second light source pad. The light emitting device may include a first feedback line that may transmit a feedback voltage of the first light emitting unit to the first light source pad, and an n-th feedback line that may transmit a feedback voltage of the second light emitting unit to the second light source pad. The first feedback line and the n-th feedback line may have different lengths.

In an embodiment, the display device may further include a flexible circuit board having an end electrically connected to the light source pads of the light source panel, and the another end electrically connected to the substrate pads of the printed circuit board, wherein the flexible circuit board electrically may connect the light source pads and the substrate pads.

In an embodiment, the display device may further include a reflection member disposed on an upper portion of the light source panel, and reflecting light emitted from the light emitting units to the display panel.

In an embodiment, the display device may further include an optical sheet disposed between the reflection member and the display panel.

BRIEF DESCRIPTION OF THE DRAWINGS

The accompanying drawings are included to provide a further understanding, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
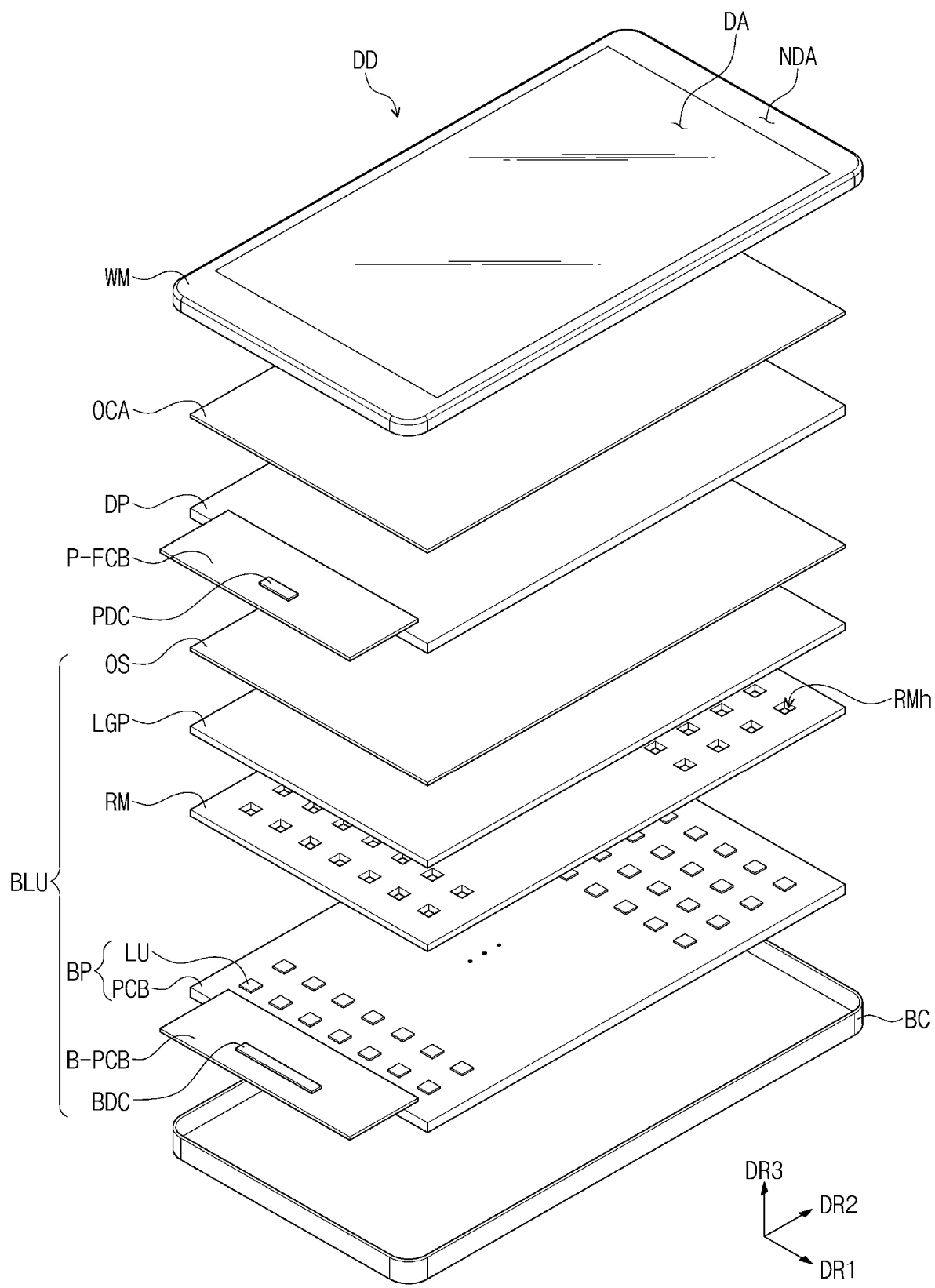
FIG. 1 is an exploded perspective view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some of the parts which are not associated with the description may not be provided in order to describe embodiments of the disclosure and like reference numerals refer to like elements throughout the specification.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is an exploded perspective view of a display device according to an embodiment.

Referring to FIG. 1, a display device DD may include a window member WM, an adhesive member OCA, a display panel DP, a panel circuit board P-FCB, a light emitting device, and a bottom case BC. The light emitting device will be described as a backlight unit BLU in the description of embodiments. However, the embodiments of the light emitting device of the disclosure are not limited to a backlight unit.

The window member WM may provide a front surface of the display device DD. The window member WM may include a glass substrate, a sapphire substrate, a plastic substrate, and the like within the spirit and the scope of the disclosure. The window member WM may include a functional coating layer such as an anti-fingerprint layer, an anti-reflection layer, and/or a hard coating layer. In an embodiment, FIG. 1 shows the window member WM having a flat shape in a display region DA. However, the shape of the window member WM may be changed. Edges of the window member WM facing in a first direction DR1 may provide a curved surface.

The display device DD may display an image or images toward a third direction DR3 on a display surface parallel to each of the first direction DR1 and a second direction DR2. The display surface on which the image or images may be displayed may correspond to the front surface of the display device DD. The display device DD may include regions separated on the display surface. The display surface may include the display region DA in which an image or images may be displayed and a non-display region NDA adjacent to the display region DA. The non-display region NDA may be referred to as a bezel region. As an example, the display region DA may have a quadrangular shape. The non-display region NDA may surround the display region DA. However, this is only exemplary. The non-display region NDA may be located or disposed adjacent to only one side of the display region DA, or may be omitted. Although not shown, as an example, the display device DD may include a partially curved shape. As a result, the display device DD may have a shape in which one region of the display region DA may be curved.

A front surface (or an upper surface, or a first surface) and a back surface (or a lower surface, or a second surface) of each member may be defined on the basis of a direction in which an image or images may be displayed. However, directions indicated by the first to third directions DR1, DR2, and DR3 are a relative concept, and may be converted to, or applicable to, different directions. Hereinafter, first to third directions are directions indicated by the first to third directions DR1, DR2, and DR3, respectively, and are given the same reference numerals.

The display panel DP may be disposed on a back surface of the window member WM and may generate an image or images. The display panel DP may detect a user's touch input. In an embodiment, the display panel DP which provides a flat display surface is exemplarily shown. However, the shape of the display panel DP may be changed within the spirit and the scope of the disclosure. Edges of the display panel DP facing in the first direction DR1 may provide a curved surface by being bent from central portions.

The display panel DP is a panel which may display an image or images, and may be any one of a liquid crystal display (LCD) panel, an electrophoretic display panel, an organic light emitting diode (OLED) panel, a light emitting diode (LED) panel, an inorganic electro luminescent (EL) display panel, a field emission display (FED) panel, a surface-conduction electron-emitter display (SED) panel, a plasma display panel (PDP), or a cathode ray tube (CRT). However, the disclosure is not limited thereto. Hereinafter, as a display device according to an embodiment, a liquid crystal display device will be exemplarily described, and the display panel DP will also be described as being a liquid crystal display panel. However, the display device DD and the display panel DP are not limited thereto. Various types of display devices and display panels may be used within the spirt and the scope of the disclosure.

The adhesive member OCA may be disposed between the window member WM and the display panel DP. The adhesive member OCA may be an optical transparent adhesive member, but the embodiment is not limited thereto. In an embodiment, the adhesive member OCA between the window member WM and the display panel DP may be omitted.

The panel circuit board P-FCB may be implemented as a flexible printed circuit board. One end of the panel circuit board P-FCB may be bonded on pads located or disposed in a region of the display panel DP to be electrically connected to the display panel DP.

The panel circuit board P-FCP may include a panel driving circuit PDC. According to an embodiment, the panel driving circuit PDC may be implemented as an integrated circuit (IC) and mounted on the panel circuit board P-FCB in a chip on film (COF) manner. Although not separately illustrated, on the panel circuit board P-FCB, passive elements and active elements may be further mounted. The panel circuit board P-FCB may provide an electrical signal to the display panel DP through signal lines.

The backlight unit BLU may be located or disposed on a back surface of the display panel DP, and may provide light to the display panel DP. In an embodiment, the backlight unit BLU is shown and described as being located or disposed on a back surface of the display panel DP. However, the disclosure is not limited thereto. For example, the backlight unit BLU may be located or disposed on one side of the display panel DP. The backlight unit BLU may include an optical sheet OS, a diffusion plate LGP, a reflection member RM, a light source panel BP and a printed circuit board B-PCB.

The light source panel BP may include a circuit board PCB and light emitting units LU. The circuit board PCB may be interposed between the display panel DP and the bottom case BC to support the light emitting units LU, and may transmit a voltage and various signals to the light emitting units LU. The circuit board PCB may have a cuboid plate shape. The circuit board PCB may be a glass substrate having low thermal deformation. However, the embodiment is not limited thereto. The circuit board PCB may be replaced with a synthetic resin substrate which may be transparent and has high heat resistance.

The light emitting units LU may be mounted on the circuit board PCB. The light emitting units LU may generate light to be transmitted to the display panel DP by a voltage being applied from the outside. The light emitting units LU may be positioned on the same plane. In an embodiment, each of the light emitting units LU may include a light emitting diode (LED), but the embodiment is not limited thereto. Each of the light emitting units LU may mean any element capable of emitting light. In an embodiment, the light emitting units LU may be arranged in a matrix form, but the embodiment is not limited thereto. The arrangement form of the light emitting units LU may be changed according to the shape and size of the display panel DP.

Each of the light emitting units LU may emit blue light. In an embodiment, each of the light emitting units LU may be a blue light emitting diode including a gallium nitride-based semiconductor, but the embodiment is not limited thereto. Each of the light emitting units LU may mean any element capable of emitting blue light. The light emitting units LU may emit light of other colors aside from blue light.

Each of the light emitting units LU may include a top emitting type lens. For example, light generated from each of the light emitting units LU may be emitted in an upper direction of the light emitting units LU. In other words, the backlight unit BLU according to an embodiment may be a top view type backlight assembly.

The reflection member RM may be interposed between the diffusion plate LGP and the light source panel BP. In an embodiment, when the circuit board PCB of the light source panel BP is a glass substrate, light emitted from the light emitting units LU travels not only in the direction of the display panel DP (for example, the third direction DR3) but also in the direction of the bottom case BC. The reflection member RM may change the path of light emitted from the light emitting units LU and traveling in the direction of the bottom case BC into the direction of the display panel DP (for example, the third direction DR3). Although not illustrated in the drawing, the reflection member RM may include an adhesive material bonded to the circuit board PCB. In an embodiment, the reflection member RM may be interposed between the light source panel BP and the bottom case BC.

The reflection member RM may include insertion holes RMh. Each of the light emitting units LU may correspond to each of the insertion holes RMh. For example, the light emitting units LU may each be inserted into the insertion holes RMh.

The diffusion plate LGP may be positioned on the reflection member RM. For example, the diffusion plate LGP may be positioned between the optical sheet OS and the reflection member RM. The diffusion plate LGP may serve to improve the luminance uniformity of light incident from the light emitting unit LU.

The optical sheet OS may be located or disposed on an upper portion of the diffusion plate LGP. For example, an optical member OM may be located or disposed between the display panel DP and the diffusion plate LGP. The optical sheet OS may modulate the optical properties of light emitted from the light source panel BP and then passing through the diffusion plate LGP. The optical sheet OS may be provided in plurality, and the optical sheets OS may be stacked to overlap each other to supplement each other. For example, the optical sheet OS may include a prism sheet and the like within the spirt and the scope of the disclosure.

The printed circuit board B-FCB may be implemented as a flexible printed circuit board. An end of the printed circuit board B-PCB may be bonded on pads located or disposed in a region of the light source panel BP to be electrically connected to the light source panel BP. The printed circuit board B-PCB may include a light source driving circuit BDC.

According to an embodiment, the light source driving circuit BDC may be implemented as an integrated circuit (IC) and mounted on the printed circuit board B-FCB in a chip on film (COF) manner. In an embodiment, although not separately illustrated, passive elements and active elements may be mounted on the printed circuit board B-FCB. The printed circuit board B-FCB may provide an electrical signal to the light source panel BP through signal lines, and may receive a feedback signal from the light source panel BP.

In an embodiment, the panel circuit board P-FCB and the printed circuit board B-PCB may be located or disposed to face each other at an end of each of the display panel DP and the light source panel BP, but the disclosure is not limited thereto. In an embodiment, the panel circuit board P-FCB and the printed circuit board B-PCB may be arranged spaced apart from each other in the second direction DR2. For example, the panel circuit board P-FCB may be electrically connected to a side of the display panel DP, and the printed circuit board B-PCB may be electrically connected to another end of the light source panel BP corresponding to another end of the display panel DP.

The display device DD according to an embodiment may include the bottom case BC. The window member WM and the bottom case BC may be bonded to each other to accommodate the display panel DP and the light source panel BP.

Although not illustrated in the drawing, the panel driving circuit PDC of the panel circuit board P-FCB and the light source driving circuit BDC of the printed circuit board B-PCB may be electrically connected through a separate circuit board. When the panel driving circuit PDC and the light source driving circuit BDC are electrically connected, the panel driving circuit PDC may control the light source driving circuit BDC to implement the luminance control and/or local dimming of the light emitting units LU.

Figure 2:
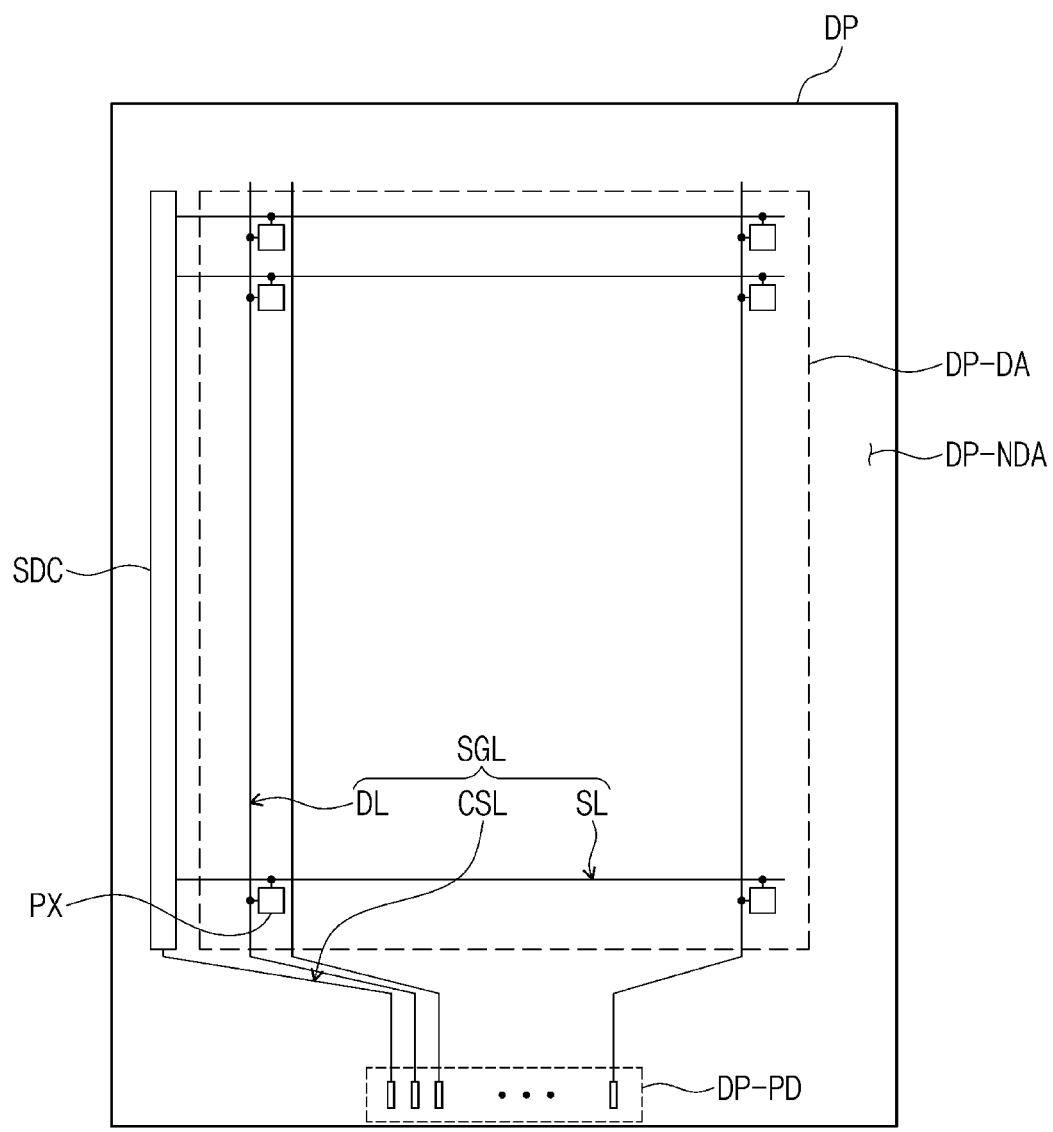
FIG. 2 is a plan view of a display unit according to an embodiment.

FIG. 2 is a plan view of a display unit according to an embodiment. FIG. 2 schematically shows a signal circuit diagram. For ease of description, some components may be omitted from the FIG. 2.

As shown in FIG. 2, the display panel DP may include a display region DP-DA and a non-display region DP-NDA. In an embodiment, the non-display region DP-NDA may be defined along the edge of the display region DP-DA. The display region DP-DA and the non-display region DP-NDA of the display panel DP may respectively correspond to the display region DA and the non-display region NDA of the display device DD.

The display panel DP may include a scan driving circuit SDC, signal lines SGL (hereinafter, signal lines), signal pads DP-PD (hereinafter, signal pads), and pixels PX (hereinafter, pixels). The pixels PX may be located or disposed in the display region DP-DA. Each of the pixels PX may include a liquid crystal capacitor (not shown) and a driving transistor (not shown) electrically connected thereto.

The scan driving circuit SDC may generate scan signals (hereinafter, scan signals), and sequentially output the scan signals to scan lines SL (hereinafter, scan lines) to be described later. The scan driving circuit SDC may output another control signal to a driving circuit of the pixels PX.

The scan driving circuit SDC may include thin film transistors formed through the same process as that of the driving circuit of the pixels PX, for example, a low temperature polycrystalline silicon (LTPS) process and/or a low temperature polycrystalline oxide (LTPO) process. In FIG. 2, the scan driving circuit SDC is shown and described as being located or disposed in the non-display region DP-NDA adjacent to the display region DP-DA of the display panel DP. However, the disclosure is not limited thereto. For example, the scan driving circuit SDC may be implemented as an independent circuit or an integrated circuit and electrically connected to a side of the display panel DP. In an embodiment, the scan driving circuit SDC may be implemented as an independent circuit or an integrated circuit and mounted on the panel circuit board P-FCB.

The signal lines SGL may include the scan lines SL, data lines DL, and a control signal line CSL. Each of the scan lines SL may be electrically connected to a corresponding pixel PX among the pixels PX, and each of the data lines DL may be electrically connected to a corresponding pixel PX among the pixels PX. The control signal line CSL may provide control signals to the scan driving circuit SDC.

The signal lines SGL may overlap the display region DP-DA and the non-display region DP-NDA. The signal lines SGL may include a pad unit and a line unit. The line unit may overlap the display region DP-DA and the non-display region DP-NDA. The pad unit may be electrically connected to an end of the line unit. The pad unit may be located or disposed in the non-display region DP-NDA and overlap a corresponding signal pad among signal pads DP-PD.

As an example, the line unit electrically connected to the pixel PX may constitute the majority of the signal lines SGL. The line unit may be electrically connected to driving transistors (not shown) of the pixel PX. The line unit may have a single-layered or multi-layered structure, and the line unit may be a single body, or may include two or more other parts. The two or more parts may be located or disposed on different layers, and may be electrically connected to each other through a contact hole passing through an insulation layer located or disposed between the two or more parts.

The panel driving circuit PDC that may control the operation of a display unit DU may be located or disposed on the panel circuit board P-FCB. The panel driving circuit PDC may be mounted on the panel circuit board P-FCB in the form of an integrated circuit chip. The panel circuit board P-FCB may include circuit board pads PCB-PD electrically connected to the display panel DP. Although not shown, the panel circuit board P-FCB may include signal lines that may electrically connect the circuit board pads PCB-PD and the panel driving circuit PDC.

When the display panel DP and the panel circuit board P-FCB are electrically connected, a portion of the panel circuit board P-FCB may partially overlap an upper portion of the display panel DP. In this case, the signal pads DP-PD may be located or disposed on an upper surface of the display panel DP, and the circuit board pads PCB-PD may be located or disposed on a lower surface of the panel circuit board P-FCB. In an embodiment, when the display panel DP and the panel circuit board P-FCB are electrically connected, a portion of the panel circuit board P-FCB may partially overlap a back surface of the display panel DP. In this case, the signal pads DP-PD may be located or disposed on the back surface of the display panel DP, and the circuit board pads PCB-PD may be arranged on an upper surface of the panel circuit board P-FCB.

Figure 3:
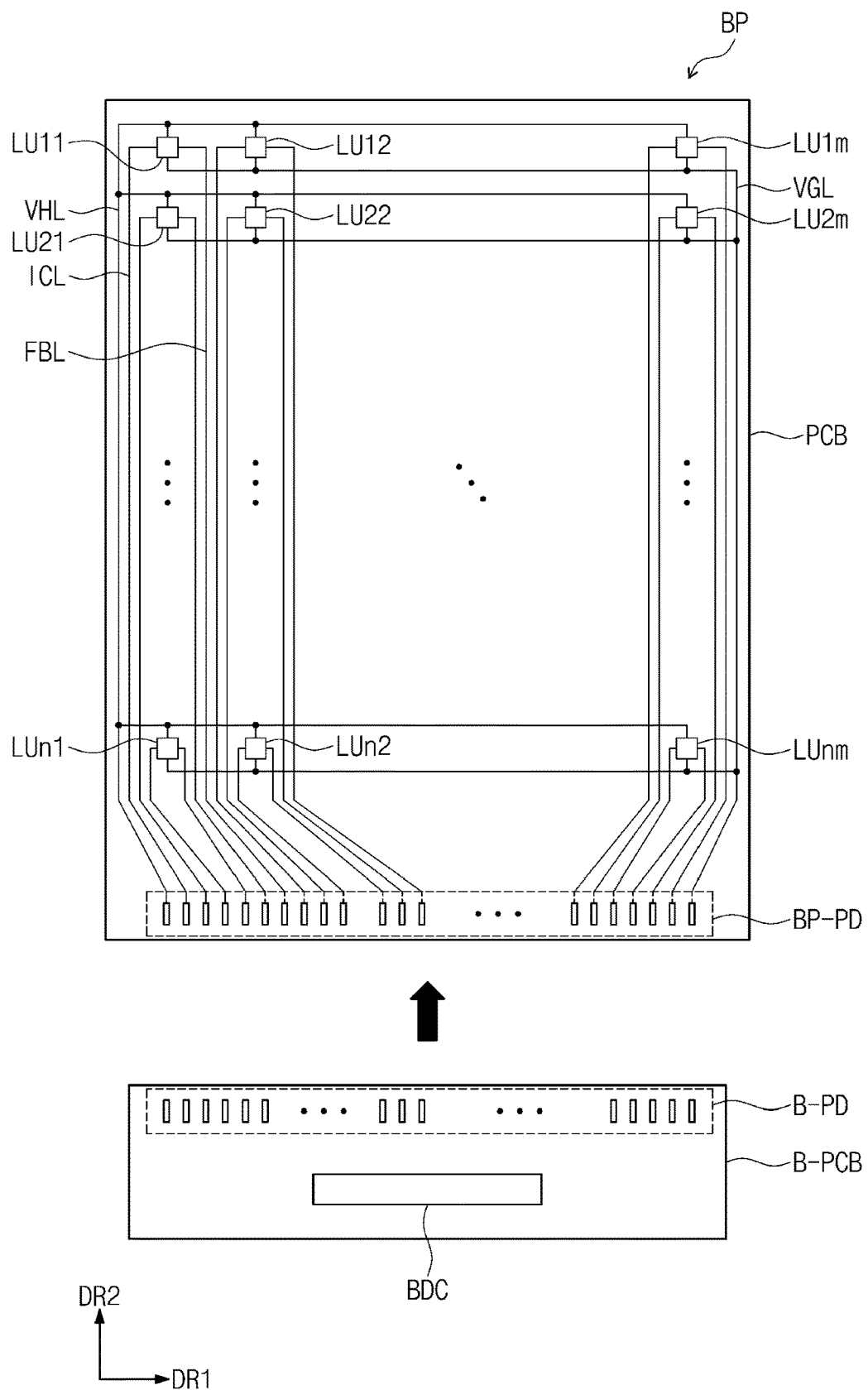
FIG. 3 is a plan view of a light source panel according to an embodiment.

FIG. 3 is a plan view of the light source panel BP according to an embodiment.

Referring to FIG. 3, the light source panel BP may include light source units LU11 to LUnm, a first voltage line VHL, a second voltage line VGL, a current control line ICL, a feedback line FBL, and light source pads BP-PD located or disposed on the circuit board PCB.

The circuit board PCB may have a rectangular shape defined by the first direction DR1 and the second direction DR2. The light source units LU11 to LUnm may be arranged in a matrix form located or disposed in the first direction DR1 and the second direction DR2. The arrangement manner of the light source units LU11 to LUnm may be changed according to the shape and size of the display panel DP (for example, as shown in FIG. 2). For example, the light source units LU11 to LUnm may be arranged in a zigzag form in the first direction DR1 and in a zigzag form in the second direction DR2 to crisscross each other.

The light source panel BP may include light emitting units in the first direction DR1 and may include n (n is a natural number) light emitting units in the second direction DR2. Each of the light source units LU11 to LUnm may include a light emitting diode. The circuit configuration and operation of each of the light source units LU11 to LUnm will be described in detail later.

The panel driving circuit BDC that may control the operation of the light source panel BP may be located or disposed on the printed circuit board B-PCB. The light source driving circuit BDC may be mounted on the printed circuit board B-FCB in the form of an integrated circuit chip. The printed circuit board B-FCB may include light source board pads B-PD electrically connected to the light source panel BP. Although not shown, the printed circuit board B-PCB may include signal lines that may electrically connect the light source board pads B-PD and the light source driving circuit BDC.

When the light source panel BP and the printed circuit board B-PCB are electrically connected, a portion of the printed circuit board B-PCB may partially overlap an upper portion of the light source panel BP. In this case, the light source pads BP-PD may be located or disposed on an upper surface of the light source panel BP, and the light source board pads B-PD may be located or disposed on a lower surface of the printed circuit board B-PCB. In an embodiment, when the light source panel BP and the printed circuit board B-PCB are electrically connected, a portion of the printed circuit board B-PCB may partially overlap a back surface of the light source panel BP. In this case, the light source pads BP-PD may be located or disposed on the back surface of the light source panel BP, and the light source board pads B-PD may be located or disposed on an upper surface of the printed circuit board B-PCB.

The first voltage line VHL may be a voltage line that may provide a first power supply voltage (for example, a power supply voltage) from the light source driving circuit BDC to the light source units LU11 to LUnm. The second voltage line VGL may be a voltage line that may provide a second power supply voltage (for example, a ground voltage) from the light source driving circuit BDC to the light source units LU11 to LUnm. The current control line ICL may be a signal line that may transmit a current control signal from the light source driving circuit BDC to the light source units LU11 to LUnm. The feedback line FBL may be a signal line that may transmit a feedback signal from each of the light source units LU11 to LUnm to the light source driving circuit BDC.

Figure 4:
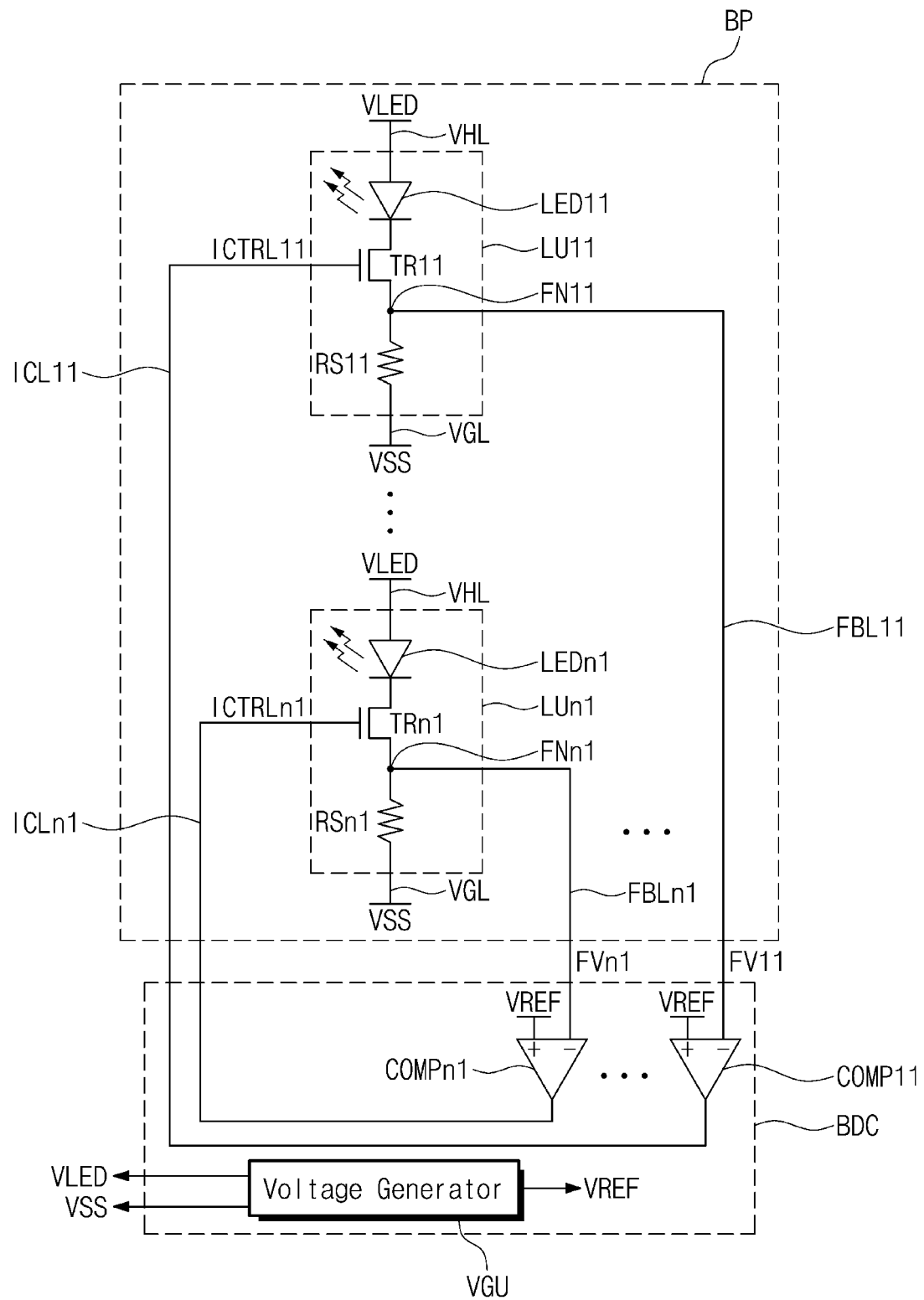
FIG. 4 is an equivalent circuit diagram showing the circuit connection relationship between light source units of light source units and a light source driving circuit shown in FIG. 3.

FIG. 4 is an equivalent circuit diagram showing the circuit connection relationship between light source units LU11 and LUn1 among the light source units and the light source driving circuit BDC shown in FIG. 3.

Hereinafter, for convenience of explanation, a light source unit LU11 will be referred to as a first light source unit, and a light source unit LUn1 will be referred to as an n-th light source unit. In FIG. 4, only the first light source unit LU11 and the n-th light source unit LUn1 of the light source units shown in FIG. 3 are shown and described. However, the rest of the light source units may also include a circuit configuration similar to that of the first light source unit LU11 and the n-th light source unit LUn1. For example, in FIG. 4, the circuit configuration of the light source driving circuit BDC that may control the first light source unit LU11 and the n-th light source unit LUn1 is shown and described. However, the circuit configuration that may drive the other light source units may be similar and the disclosure is not limited thereto.

The first light source unit LU11 may include a first light emitting diode LED11, a first transistor TR11 (or a switching element), and a first resistor RS11. The first light emitting diode LED11 may include a first electrode and a second electrode. The first electrode of the first light emitting diode LED11 may be electrically connected to the first voltage line VHL. The first voltage line VHL may be a voltage line that may transmit a first power supply voltage VLED from the light source driving circuit BDC. In FIG. 4, the first light source unit LU11 is shown and described as including only one first light emitting diode LED11. However, the disclosure is not limited thereto. For example, the first light source unit LU11 may include light emitting diodes electrically connected in series.

The first light emitting diode LED11 may generate light corresponding to a current flowing between the first electrode and the second electrode. The first light emitting diode LED11 may have a structure in which an n-type semiconductor layer, an active layer, and a p-type semiconductor layer may be sequentially stacked. In an embodiment, the first light emitting diode LED11 may be a blue light emitting diode including a gallium nitride-based semiconductor, but the embodiment is not limited thereto. The first light emitting diode LED11 may mean any element capable of emitting blue light, for example.

The first transistor TR11 may include a first electrode electrically connected to the second electrode of the first light emitting diode LED11, a second electrode electrically connected to a first feedback node FN11, and a gate electrode electrically connected to a first current control line ICL11. The first current control line ICL11 may be a signal line that may transmit a first current control signal ICTRL11 from the light source driving circuit BDC. Accordingly, the first transistor TR11 may be turned on or off in response to the first current control signal ICTRL11 from the light source driving circuit BDC.

A first terminal of the first resistor RS11 may be electrically connected to the first feedback node FN11, and a second terminal thereof may be electrically connected to the second voltage line VGL. The second voltage line VGL may be a voltage line that may transmit a second power supply voltage VSS from the light source driving circuit BDC.

The voltage of the first feedback node FN11 may be provided to the light source driving circuit BDC through a first feedback line FBL11.

In an example shown in FIG. 4, the first light source unit LU11 may be shown and described as including the first light emitting diode LED11, the first transistor TR11, and the first resistor RS11. However, the first light source unit LU11 may include only the first light emitting diode LED11 and the first transistor TR11. The first resistor RS11 may be separately formed on the circuit board PCB.

The n-th light source unit LUn1 may include an n-th light emitting diode LEDn1, an n-th transistor TRn1 (or a switching element), and an n-th resistor RSn1. The n-th light emitting diode LEDn1 may include a first electrode and a second electrode. The first electrode of the n-th light emitting diode LEDn1 may be electrically connected to the first voltage line VHL. The first voltage line VHL may be a voltage line that may transmit the first power supply voltage VLED from the light source driving circuit BDC. In FIG. 4, the n-th light source unit LUn1 may be shown and described as including only one n-th light emitting diode LEDn1. However, the disclosure is not limited thereto. For example, the n-th light source unit LUn1 may include light emitting diodes electrically connected in series.

The n-th light emitting diode LEDn1 may generate light corresponding to a current flowing between the first electrode and the second electrode. The n-th light emitting diode LEDn1 may have a structure in which an n-type semiconductor layer, an active layer, and a p-type semiconductor layer may be sequentially stacked. In an embodiment, the n-th light emitting diode LEDn1 may be a blue light emitting diode including a gallium nitride-based semiconductor, but the embodiment is not limited thereto. The n-th light emitting diode LEDn1 may mean any element capable of emitting blue light.

The n-th transistor TRn1 may include a first electrode electrically connected to the second electrode of the n-th light emitting diode LEDn1, a second electrode electrically connected to an n-th feedback node FNn1, and a gate electrode electrically connected to an n-th current control line ICLn1. The n-th current control line ICLn1 may be a signal line that may transmit an n-th current control signal ICTRLn1 from the light source driving circuit BDC. Accordingly, the n-th transistor TRn1 may be turned on or off in response to the n-th current control signal ICTRLn1 from the light source driving circuit BDC.

A first terminal of the n-th resistor RSn1 may be electrically connected to the n-th feedback node FNn1, and a second terminal thereof may be electrically connected to the second voltage line VGL. The second voltage line VGL may be a voltage line that may transmit the second power supply voltage VSS from the light source driving circuit BDC.

The voltage of the n-th feedback node FNn1 may be provided to the light source driving circuit BDC through an n-th feedback line FBLn1.

In an example shown in FIG. 4, the n-th light source unit LUn1 may be shown and described as including the n-th light emitting diode LEDn1, the n-th transistor TRn1, and the n-th resistor RSn1. However, the n-th light source unit LUn1 may include only the n-th light emitting diode LEDn1 and the n-th transistor TRn1. The n-th resistor RSn1 may be separately formed on the circuit board PCB.

The light source driving circuit BDC may include a first comparator COMP11, an n-th comparator COMPn1 and a voltage generator VGU. The first comparator COMP11 may compare a first feedback voltage FV11 received through the first feedback line FBL11 and a reference voltage VREF, and output the first current control signal ICTR11. The n-th comparator COMPn1 may compare an n-th feedback voltage FVn1 received through the n-th feedback line FBLn1 and the reference voltage VREF, and output the n-th current control signal ICTRn1. The voltage generator VGU may generate the first power supply voltage VLED, the second power supply voltage VSS and the reference voltage VREF.

Figure 5:
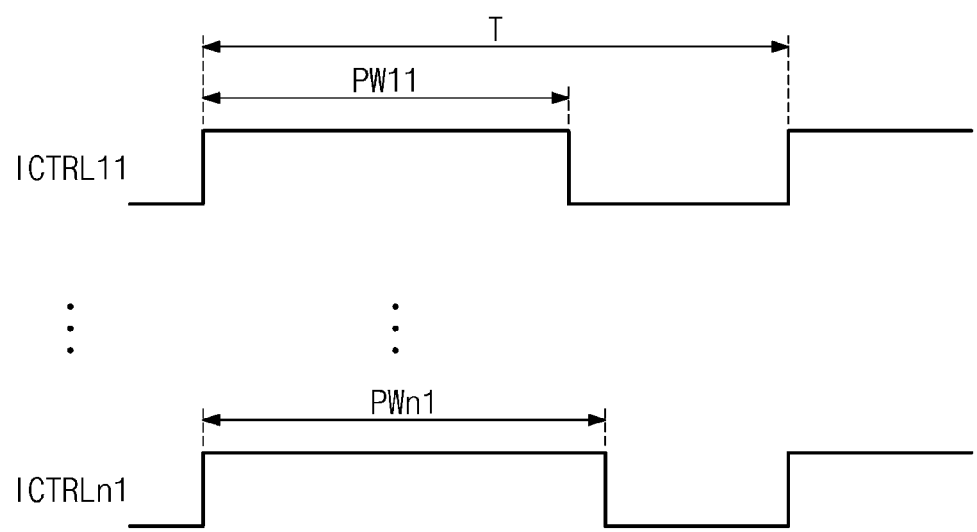
FIG. 5 is a timing diagram showing a first current control signal outputted from a first comparator and an n-th current control signal outputted from an n-th comparator shown in FIG. 4.

FIG. 5 is a timing diagram exemplarily showing the first current control signal ICTRL11 outputted from the first comparator COMP11 and the n-th current control signal ICTRLn1 outputted from the n-th comparator COMPn1.

Referring to FIG. 4 and FIG. 5, each of the first current control signal ICTRL11 and the n-th current control signal ICTRLn1 may be a pulse signal transitioning to a high level at each predetermined period T. The first comparator COMP11 may output the first current control signal ICTRL11 of a high level when the first feedback voltage FV11 is lower than the reference voltage VREF, and may output the first current control signal ICTRL11 of a low level when the first feedback voltage FV11 is higher than the reference voltage VREF. For example, according to the voltage level of the first feedback voltage FV11 and the reference voltage VREF, a pulse width PW11 of the first current control signal ICTRL11 may be determined. According to the pulse width PW11 of the first current control signal ICTRL11, the turn-one duration of the first transistor TR11 may be controlled, and accordingly, the amount of current flowing through the first light emitting diode LED11 may be controlled.

The n-th comparator COMPn1 may output the n-th current control signal ICTRLn1 of a high level when the n-th feedback voltage FVn1 is lower than the reference voltage VREF, and may output the n-th current control signal ICTRLn1 of a low level when the n-th feedback voltage FVn1 is higher than the reference voltage VREF. For example, according to the voltage level of the n-th feedback voltage FVn1 and the reference voltage VREF, a pulse width PWn1 of the n-th current control signal ICTRLn1 may be determined. According to the pulse width PWn1 of the n-th current control signal ICTRLn1, the turn-one duration of the n-th transistor TRn1 may be controlled, and accordingly, the amount of current flowing through the n-th light emitting diode LEDn1 may be controlled.

The first light source unit LU11 and the n-th light source unit LUn1 shown in FIG. 4 are light source units that may be spaced farthest apart from the circuit board PCB shown in FIG. 3 in the second direction DR2. The first feedback line FBL11 and the n-th feedback line FBLn1 may have different lengths, so that the wiring resistance of the first feedback line FBL11 and the wiring resistance of the n-th feedback line FBLn1 may be different from each other. The first light source unit LU11 may provide the first feedback voltage FV11 of the first feedback node FN11 to the light source driving circuit BDC by including the first resistor RS11. The n-th light source unit LUn1 may provide the n-th feedback voltage FVn1 of the n-th feedback node FNn1 to the light source driving circuit BDC by including the n-th resistor RSn1.

Each of the first comparator COMP11 and the n-th comparator COMPn1 may be an operational amplifier which may compare the first feedback voltage FV11 and the n-th feedback voltage Fvn1 with the reference voltage VREF, so that input impedance (resistance) may be infinite. Accordingly, an error between the wiring resistance of the first feedback line FBL11 and the wiring resistance of the n-th feedback line FBLn1 may be ignored. In other words, even if an error between the wiring resistance of the first feedback line FBL11 and the wiring resistance of the n-th feedback line FBLn1 is great, the comparison result of each of the first comparator COMP11 and the n-th comparator COMPn1 may not be affected. Therefore, it may be possible to control a constant current for the first light source unit LU11 and the n-th light source unit LUn1.

When the circuit board PCB is a glass substrate, a signal line and a voltage line formed on the circuit board PCB may be formed as a fine pattern (of about several micrometers or less). In a comparative embodiment, the first light source unit LU11 and the n-th light source unit LUn1 may not be provided with the first resistor RS11 and the n-th resistor RSn1, respectively. In this case, in order to control the constant current for the first light source unit LU11 and the n-th light source unit LUn1, current flowing through the first light emitting diode LED11 and the n-th light emitting diode LEDn1 may be fed back to the light source driving circuit BDC through the first feedback line FBL11 and the n-th feedback line FBLn1. However, when the deviation between the wiring resistance of the first feedback line FBL11 and the wiring resistance of the n-th feedback line FBLn1 is great, the light source driving circuit BDC may require a compensation resistor to compensate for the resistance deviation. In this case, power may be unnecessarily consumed by the compensation resistor, and production costs may be increased in order to provide the compensation resistor.

In an embodiment, the first resistor RS11 in the first light source unit LU11 and the n-th resistor RSn1 in the n-th light source unit LUn1 may be selected to have a minimum resistance value (for example, about 5 ohm[Ω]) to allow the first feedback voltage FV11 and n-th feedback voltage FVn1 to be detected. Accordingly, power consumption by the first resistor RS11 and the n-th resistor RSn1 may be reduced to a minimum. For example, a separate resistor that may compensate for the resistance deviation between the first feedback line FBL11 and the n-th feedback line FBLn1 may not be required.

In an embodiment, each of the first transistor TR11 in the first light source unit LU11 and the n-th transistor TRn1 in the n-th light source unit LUn1 may be an NMOS transistor. However, the disclosure is not limited thereto. For example, when the first transistor TR11 and the n-th transistor TRn1 are PMOS transistors, the polarity of the first current control signal ICTRL11 and the n-th current control signal ICTRLn1, respectively, outputted from the first comparator COMP11 and the n-th comparator COMPn1 may be opposite to that shown in FIG. 5. For example, the first comparator COMP11 may output the first current control signal ICTRL11 of a low level when the first feedback voltage FV11 is lower than the reference voltage VREF, and may output the first current control signal ICTRL11 of a high level when the first feedback voltage FV11 is higher than the reference voltage VREF. For example, the n-th comparator COMPn1 may output the n-th current control signal ICTRLn1 of a low level when the n-th feedback voltage FVn1 is lower than the reference voltage VREF, and may output the n-th current control signal ICTRLn1 of a high level when the n-th feedback voltage FVn1 is higher than the reference voltage VREF.

Figure 6:
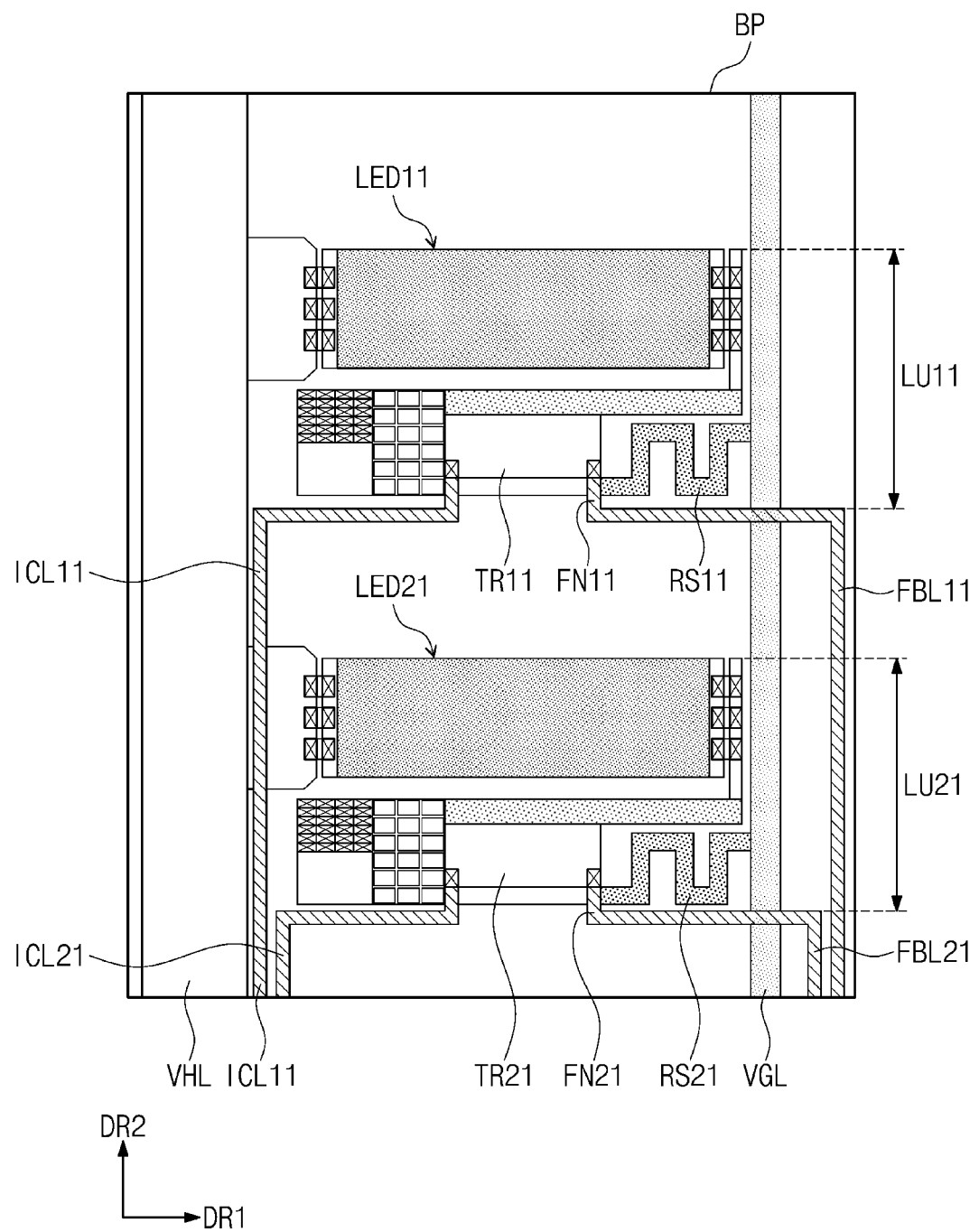
FIG. 6 is a plan view of a portion a light source panel according to an embodiment.

FIG. 6 is a plan view of a portion the light source panel BP according to an embodiment.

FIG. 6 is a plan view of the light source panel BP in which some light source units LU11 and LU21 may be located or disposed among the light source units shown in FIG. 3. Hereinafter, for convenience of explanation, the light source unit LU11 will be referred to as a first light source unit, and a light source unit LU21 will be referred to as a second light source unit. In FIG. 6, only the first light source unit LU11 and the second light source unit LU21 of the light source units shown in FIG. 3 are shown and described. However, the rest of the light source units may also be similarly located or disposed to the light source unit LU11 and the second light source unit LU21.

Referring to FIG. 6, the first light source unit LU11 may include the first light emitting diode LED11, the first transistor TR11, and the first resistor RS11. The first voltage line VHL may be electrically connected to the first light emitting diode LED11. The first current control line ICL11 may be electrically connected to the gate electrode of the first transistor TR11. The second voltage line VGL may be electrically connected to the second terminal of the first resistor RS11. The first feedback line FBL11 may be electrically connected to the first feedback node FN11 between the second electrode of the first transistor TR11 and the first terminal of the first resistor RS11.

The first resistor RS11 may include or may be formed as a conductive pattern having a predetermined width on the circuit board PCB. The width, length, or thickness of the first resistor RS11 may be selected to allow the first resistor RS11 to have a predetermined resistance value (for example, about 5 ohm[Ω]). For example, the first resistor RS11 may be a conductive pattern formed in any shape of spiral, polygon, circle, zigzag, or a combination thereof. The first resistor RS11 may be formed of a conductive material such as copper or a combination of copper and another conductive material. However, the shape and the material of the first resistor RS11 may be variously changed without being limited and thus the disclosure is not limited thereto.

The second light source unit LU21 may include a second light emitting diode LED21, a second transistor TR21, and a second resistor RS21. The first voltage line VHL may be electrically connected to the second light emitting diode LED21. The second current control line ICL21 may be electrically connected to a gate electrode of the second transistor TR21. The second voltage line VGL may be electrically connected to a second terminal of the second resistor RS21. A second feedback line FBL21 may be electrically connected to a second feedback node FN21 between a second electrode of the second transistor TR21 and a first terminal of the second resistor RS21.

The second resistor RS21 may include or may be formed as a conductive pattern having a predetermined width on the circuit board PCB. The width, length, and thickness of the second resistor RS21 may be selected to allow the second resistor RS21 to have a predetermined resistance value (for example, about 5 ohm[Ω]). For example, the second resistor RS21 may be a conductive pattern formed in any shape of spiral, polygon, circle, zigzag, or a combination thereof. The second resistor RS21 may be formed of a conductive material such as copper or a combination of copper and another conductive material. However, the shape and the material of the second resistor RS21 may be variously changed without being limited and thus the disclosure is not limited thereto.

Figure 7:
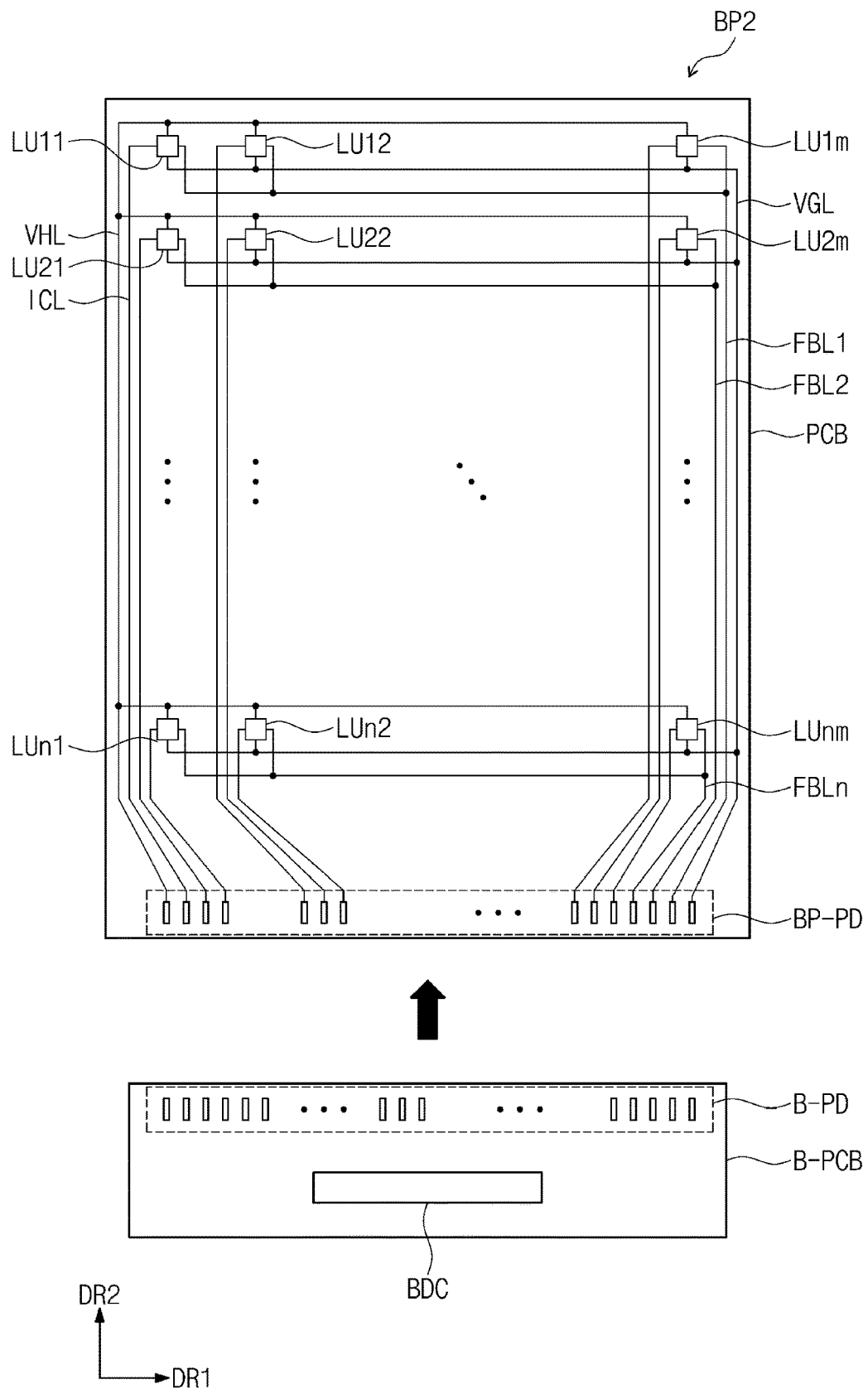
FIG. 7 is a plan view of a light source panel according to an embodiment.

FIG. 7 is a plan view of a light source panel BP2 according to an embodiment.

Similar to the light source panel BP shown in FIG. 3, the light source panel BP2 shown in FIG. 7 may include light source units LU11 to LUnm, the first voltage line VHL, the second voltage line VGL, the current control line ICL, the feedback line FBL or feedback lines FBL1, FBL2, FBLn, and the light source pads BP-PD located or disposed on the circuit board PCB.

Each of the light source units LU11 to LUnm of the light source panel BP shown in FIG. 3 may be electrically connected to the light source pads BP-PD through a dedicated feedback line FBL. Among the light source units LU11 to LUnm of the light source panel BP2 shown in FIG. 7, light source units located or disposed side by side in the first direction DR1 may be commonly electrically connected to one feedback line. For example, light source units LU11 to LU1m may be commonly electrically connected to a feedback line FBL1, light source units LU21 to LU2m may be commonly electrically connected to a feedback line FBL2, and light source units LUn1 to LUnm may be commonly electrically connected to a feedback line FBLn1.

The light source driving circuit BDC may compare feedback voltages received through the feedback lines FBL1 to FBLn1 with a reference voltage, and may output a current control signal that may control the light source units LU11 to LUnm to the current control line ICL according to the comparison result. For example, when the feedback voltage from the light source units LU11 to LU1m is higher than the reference voltage, the light source driving circuit BDC may output a current control signal to the current control line ICL to allow a current flowing through the light source units LU11 to LU1m to be reduced. As an example, when the feedback voltage from the light source units LU11 to LU1m is lower than the reference voltage, the light source driving circuit BDC may output a current control signal to the current control line ICL to allow a current flowing through the light source units LU11 to LU1m to be increased. As such, the light source driving circuit BDC may control the light source units LU11 to LUnm per row, and thus, may be capable of blocking dimming control.

In an embodiment, the light source units LU11 to LUnm may be commonly electrically connected to one feedback line by each of rows. In this case, the light source driving circuit BDC may control the light source units LU11 to LUnm per rows.

Figure 8:
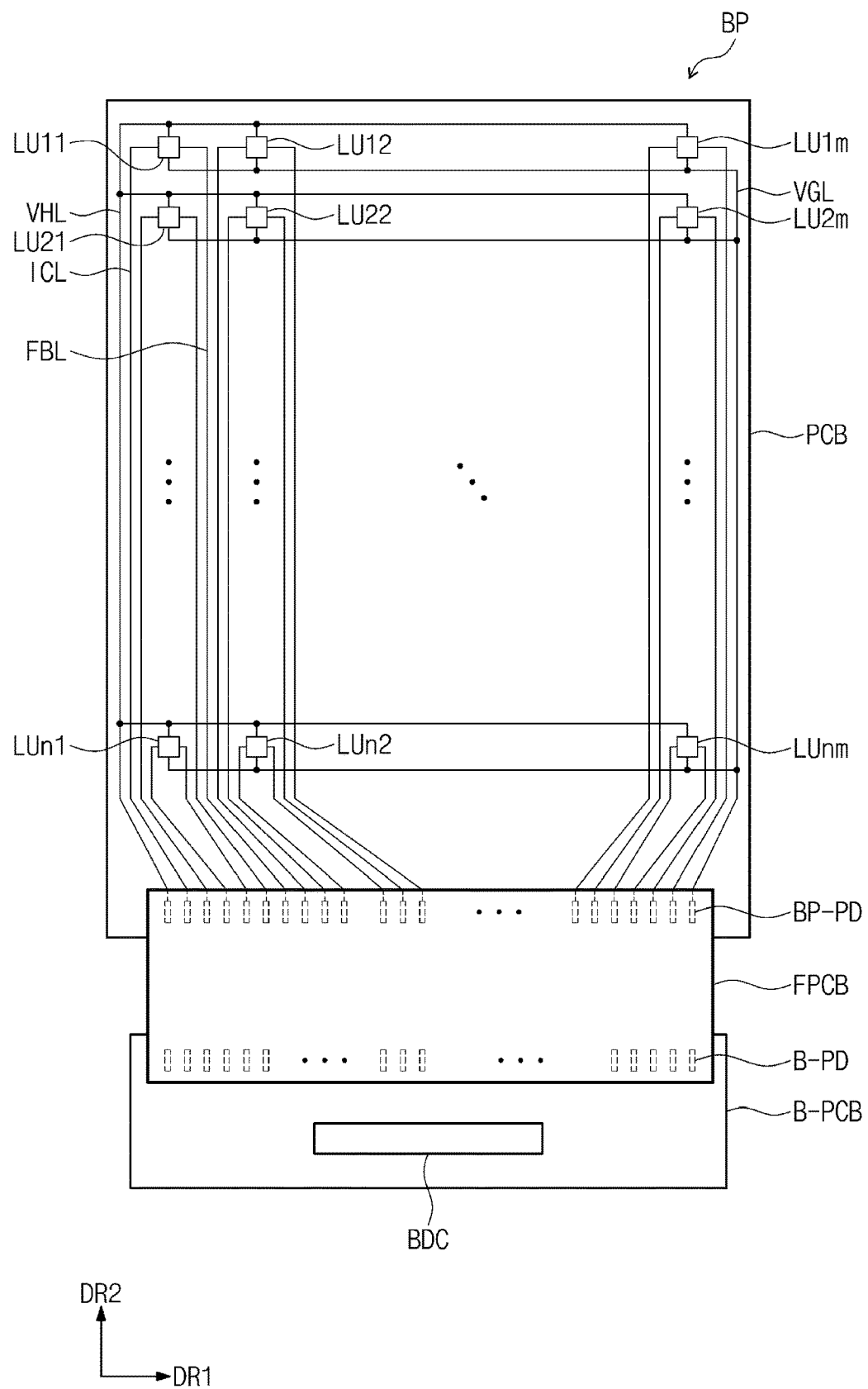
FIG. 8 is a plan view showing connections of a light source panel and a printed circuit board according to an embodiment.

FIG. 8 is a plan view showing connections of the light source panel BP and the printed circuit board B-PCB according to an embodiment. In FIG. 8, the same reference numerals are given to elements the same as those in FIG. 3, and thus redundant descriptions are omitted.

Referring to FIG. 8, the circuit board PCB of the light source panel BP may be electrically connected to the printed circuit board B-PCB through flexible circuit board FPCB. A flexible circuit board FPCB may function as a connection board. An end of the flexible circuit board FPCB may be electrically connected or coupled to the circuit board PCB, and another end of the flexible circuit board FPCB is coupled to the printed circuit board B-PCB. Although not illustrated in the drawing, the flexible circuit board FPCB may include signal lines that may electrically connect the light source pads BP-PD of the circuit board PCB and the circuit board pads PCB-PD of the printed circuit board B-PCB. For example, each of the flexible circuit boards FP1 to FP5 may be a flexible printed circuit board (FPCB).

Figure 9:
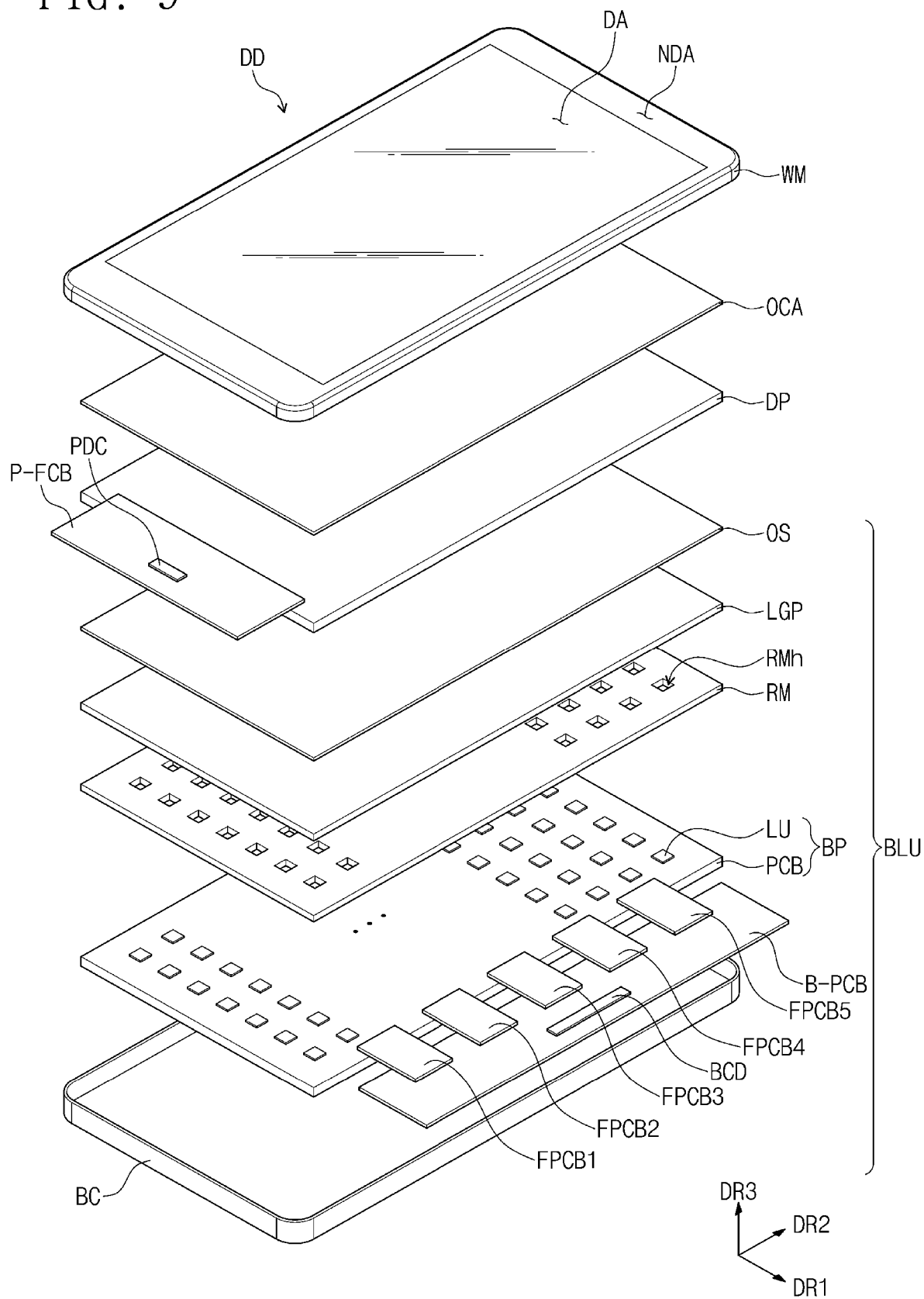
FIG. 9 is an exploded perspective view of a display device according to an embodiment.

FIG. 9 is an exploded perspective view of a display device according to an embodiment. In FIG. 9, the same reference numerals are given to elements same as those in FIG. 1, and redundant descriptions are omitted.

Referring to FIG. 9, the circuit board PCB of the light source panel BP may be electrically connected to the printed circuit board B-PCB through flexible circuit boards FPCB1 to FPCB5. The flexible circuit boards FPCB1 to FPCB5 may function as a connection board. An end of each of the flexible circuit boards FPCB1 to FPCB5 may be bonded to the circuit board PCB, and another end of each of the flexible circuit boards FPCB1 to FPCB5 may be bonded to the printed circuit board B-PCB. In an embodiment, there are 5 flexible circuit boards FPCB1 to FPCB5 electrically connected between the circuit board PCB and the printed circuit board B-PCB. However, the number of the flexible circuit boards FPCB1 to FPCB5 may be variously changed. For example, in FIG. 9, the flexible circuit boards FPCB1 to FPCB5 may be bonded to a long side of the circuit board PCB, but the embodiment is not limited thereto. For example, the flexible circuit boards FPCB1 to FPCB5 may be bonded to a short side of the circuit board PCB.

Although not illustrated in the drawing, the flexible circuit boards FPCB1 to FPCB5 may include signal lines that may electrically connect the light source pads BP-PD of the circuit board PCB and the circuit board pads PCB-PD. For example, each of the flexible circuit boards FPCB1 to FPCB5 may be a flexible printed circuit board.

Each of light emitting units in a light emitting device having the above arrangement may include a resistor formed as a conductive pattern. Accordingly, the voltage between an end of a light emitting diode and the resistor may be fed back to a light source driving circuit. The resistance value of a resistor provided in a light emitting unit may be set to a minimum value required for detecting a voltage, so that power consumption in the light emitting unit may be reduced to a minimum.

For example, the light source driving circuit may be capable of controlling the amount of current flowing through the light emitting diode by comparing a feedback voltage with a reference voltage, and thus, may be capable of controlling a constant current for the light emitting unit.

Although the disclosure has been described with reference embodiments, it will be understood by those skilled in the art that various modifications and changes in form and details may be made therein without departing from the spirit and scope of the disclosure as set forth in the following claims. In addition, the embodiments disclosed are not intended to limit the technical spirit of the disclosure, and all technical concepts falling within the scope of the following claims and equivalents thereof are to be construed as being included in the scope of the disclosure.

What is claimed is:

1. A light emitting device comprising:
   a light source panel including light emitting units; and
   a printed circuit board including a light source driving circuit electrically connected to the light source panel,
      wherein the light source driving circuit:
      receives a feedback voltage from each of the light emitting units, and
      compares the feedback voltage from each of the light emitting units with a reference voltage to output a current control signal,
   wherein each of the light emitting units comprises:
      a light emitting diode including a first terminal and a second terminal both electrically connected to a first voltage line to which a first power supply voltage is provided;
      a switching element electrically connected between the second terminal of the light emitting diode and a feedback node which outputs the feedback voltage, the switching element operating in response to the current control signal; and a resistor electrically connected between the feedback node and a second voltage line to which a second power supply voltage is provided, wherein the resistor includes a conductive pattern having a predetermined width disposed on the light source panel.

2. The light emitting device of claim 1, wherein the conductive pattern of the resistor of each of the light emitting units has a predetermined length.

3. The light emitting device of claim 1, wherein the conductive pattern of the resistor of each of the light emitting units has a predetermined thickness.

4. The light emitting device of claim 1, wherein the conductive pattern of the resistor of each of the light emitting units has a shape of a spiral, a polygon, a circle, a zigzag, or a combination of shapes.

5. The light emitting device of claim 1, wherein the light source panel is a glass substrate.

6. The light emitting device of claim 1, wherein the conductive pattern of the resistor of each of the light emitting units has a same resistance value.

7. The light emitting device of claim 1, wherein the resistor of each of the light emitting units comprises a metal wiring pattern.

8. The light emitting device of claim 1, wherein the light source driving circuit provides the first power supply voltage and the second power supply voltage.

9. The light emitting device of claim 1, wherein the switching element comprises a switching transistor including:
a first electrode electrically connected to the second terminal of the light emitting diode;
a second electrode electrically connected to the feedback node; and
a gate electrode that receives the current control signal.

10. The light emitting device of claim 1, wherein the light source driving circuit increases a pulse width of the current control signal when the feedback voltage is lower than the reference voltage, and decreases a pulse width of the current control signal when the feedback voltage is higher than the reference voltage.

11. The light emitting device of claim 1, wherein
the light source panel comprises light source pads electrically connected to the light emitting units, and
the printed circuit board comprises substrate pads electrically connected to the light source pads.

12. The light emitting device of claim 11, wherein
the light emitting units comprise a first light emitting unit and a second light emitting unit, and
the light source pads comprise a first light source pad and a second light source pad,
wherein the light emitting device further comprises:
a first feedback line that transmits a feedback voltage of the first light emitting unit to the first light source pad; and
an n-th feedback line that transmits a feedback voltage of the second light emitting unit to the second light source pad.

13. The light emitting device of claim 12, wherein a length of the first feedback line is different from a length of the n-th feedback line.

14. A display device comprising:
a display panel that displays an image; and
a light emitting device that provides light to the display panel, wherein the light emitting device comprises:
a light source panel including light emitting units; and
a printed circuit board including a light source driving circuit electrically connected to the light source panel, wherein the light source driving circuit:
receives a feedback voltage from each of the light emitting units, and
compares the feedback voltage from each of the light emitting units with a reference voltage to output a current control signal,
wherein each of the light emitting units comprises:
a light emitting diode including a first terminal and a second terminal both electrically connected to a first voltage line to which a first power supply voltage is provided;
a switching element electrically connected between the second terminal of the light emitting diode and a feedback node that outputs the feedback voltage, the switching element operating in response to the current control signal; and
a resistor electrically connected between the feedback node and a second voltage line to which a second power supply voltage is provided, wherein the resistor includes a conductive pattern having a predetermined width and length disposed on the light source panel.

15. The display device of claim 14, wherein the conductive pattern of the resistor of each of the light emitting units has a shape of a spiral, a polygon, a circle, a zigzag, or a combination of shapes.

16. The display device of claim 14, wherein the light source panel is a glass substrate.

17. The display device of claim 14, wherein the conductive pattern of the resistor of each of the light emitting units has a same resistance value.

18. The display device of claim 14, wherein the resistor of each of the light emitting units comprises a metal wiring pattern.

19. The display device of claim 14, wherein the light source driving circuit provides the first power supply voltage and the second power supply voltage.

20. The display device of claim 14, wherein the switching element comprises a switching transistor including:
a first electrode electrically connected to the second terminal of the light emitting diode;
a second electrode electrically connected to the feedback node; and
a gate electrode that receives the current control signal.

21. The display device of claim 14, wherein the light source driving circuit increases a pulse width of the current control signal when the feedback voltage is lower than the reference voltage, and decreases a pulse width of the current control signal when the feedback voltage is higher than the reference voltage.

22. The display device of claim 14, wherein
the light source panel comprises light source pads electrically connected to the light emitting units, and
the printed circuit board comprises substrate pads electrically connected to the light source pads.

23. The display device of claim 22, wherein
the light emitting units comprise a first light emitting unit and a second light emitting unit, and
the light source pads comprise a first light source pad and a second light source pad,
wherein the light emitting device further comprises:
a first feedback line that transmits a feedback voltage of the first light emitting unit to the first light source pad; and an n-th feedback line that transmits a feedback voltage of the second light emitting unit to the second light source pad, the first feedback line and the n-th feedback line having different lengths.

24. The display device of claim 22, further comprising a flexible circuit board including:
an end electrically connected to the light source pads of the light source panel; and
another end electrically connected to the substrate pads of the printed circuit board, wherein the flexible circuit board electrically connects the light source pads and the substrate pads.

25. The display device of claim 14, further comprising a reflection member disposed on an upper portion of the light source panel, the reflection member reflecting light emitted from the light emitting units to the display panel.

26. The display device of claim 25, further comprising an optical sheet disposed between the reflection member and the display panel.

* * * * *